United States Patent [19]

Mitarai

[11] Patent Number: 5,917,294
[45] Date of Patent: Jun. 29, 1999

[54] SYNCHRONIZATION CONTROL APPARATUS AND METHOD

[75] Inventor: Reiji Mitarai, Hachioji, Japan

[73] Assignee: Canon Kabushiki Kaisha, Tokyo, Japan

[21] Appl. No.: 08/705,302

[22] Filed: Aug. 29, 1996

[30] Foreign Application Priority Data

Aug. 31, 1995 [JP] Japan ................................. 7-245094

[51] Int. Cl.$^6$ ................................................. H01L 21/30
[52] U.S. Cl. ........................... 318/41; 318/85; 318/606; 318/625
[58] Field of Search ................................. 318/625, 571, 318/39, 569, 609, 610, 85, 632, 618, 601, 600, 41, 68, 606

[56] References Cited

U.S. PATENT DOCUMENTS

| 3,896,356 | 7/1975 | Hoffman et al. .................... 318/802 |
| 4,296,446 | 10/1981 | Zorbalas .............................. 360/73.08 |
| 5,162,716 | 11/1992 | Kyura et al. .......................... 318/625 |
| 5,600,221 | 2/1997 | Tomatsuri et al. ................... 318/632 |

FOREIGN PATENT DOCUMENTS

| 60-169909 | 9/1985 | Japan . |
| 62-226206 | 10/1987 | Japan . |
| 3-252704 | 11/1991 | Japan . |

*Primary Examiner*—John W. Cabeca
*Attorney, Agent, or Firm*—Fitzpatrick, Cella, Harper & Scinto

[57] ABSTRACT

A master-slave synchronization control system is constructed having two drive systems for driving respective ones of two controlled objects capable of being operated individually, wherein the drive system having the slower response is adopted as the master and the drive system having the higher response is adopted as the slave. The drive system of the master, which has the elements of a velocity control system that operates to follow up an entered velocity command value, outputs velocity information and position information of its controlled object. The drive system of the slave has a velocity control system in which the velocity information is adopted as the velocity command value, and a position compensating loop in which the position information is adopted as a position command value. The position compensating loop adds the position compensation value to the velocity command value as a correction signal. Both drive systems are driven at a velocity conforming to the input velocity command value, with the positions of these drive systems being changed in synchronized fashion.

22 Claims, 4 Drawing Sheets

SYNCHRONIZATION CONTROL APPARATUS AND METHOD

BACKGROUND OF THE INVENTION

This invention relates to a control apparatus applied to a device manufacturing apparatus that prints the pattern image from an original plate to an object to be exposed to light, particularly a scanning-type exposure apparatus ideal for blanket exposure of a large image. The control apparatus controls the drive of two axes, such control requiring a high degree of synchronizing precision and uniformity of speeds.

A control apparatus in which heavy emphasis is placed upon the synchronization of a two-axis drive system has an architecture of the kind shown in FIG. 4, by way of example. A typical example of this control apparatus is described in the specification of Japanese Patent Application Laid-Open (KOKAI) No. 60-169909.

Since the example of FIG. 4 differs from other examples of the prior art in terms expression, the special features of this arrangement will be described. In FIG. 4, G1(s), G2(s) represent closed-loop transfer functions for positional control along the respective axes. If we let P1(s), P2(s) represent the particular characteristics along the respective axes and let C1(s), C2(s) represent the characteristics of compensating devices, then the transfer functions G1(s), G2(s) can be expressed by Equation (1) below:

$$G1(s) = \frac{P1(s)C1(s)}{1 + P1(s)C1(s)}, \quad G2(s) = \frac{P2(s)C2(s)}{1 + P2(s)C2(s)} \quad (1)$$

Equation (1) makes no mention of loop control along each axis and is an expression from a standpoint focused solely upon the control mechanism for achieving synchronization between the two axes. The expression in two examples of the prior art shown below and the expression of an embodiment of the present invention differ in this respect. For the sake of simplicity, it will be assumed that this specification is directed to a synchronization relationship in which the phase ratio between the two axes is 1:1. In a case where the synchronization control apparatus is applied to synchronized drive systems for the plate stage and substrate stage in a reduced-projection exposure apparatus, it becomes necessary to take the reduction ratio and direction into account. If it is also assumed in this case that a scale conversion is performed between the two axes, a 1:1 synchronization control system can be discussed as the object of interest without sacrificing universality.

The example of FIG. 4 is a so-called master-slave control system. If FIG. 4 is subjected to an equivalent conversion in order to express it in a more easily understandable manner, the result is FIG. 5. Here a first system is driven with a reference value r serving as the input, and a second system is driven by entering a position deviation ex into the second system via a compensating arithmetic unit C3(s), where the deviation ex is between a position output y1 of the first system and a position output y2 of the second system. The position deviation ex is synchronization error and the result ux of the arithmetic control operation performed by the compensating arithmetic unit C3(s) is a synchronization manipulated variable. The position output y1 of the first system [G1(s)] is regarded as a command value, and the second system [G2(s)] constructs a feedback loop which follows up the signal y1. This example is one to which a feed-forward path has been added, wherein the slave system is directly influenced by the reference value r. It will be appreciated that this example is intended to improve response at start-up. The feed-forward portion should be considered to be a minor or auxiliary part of the arrangement in terms of architecture of synchronization control, and the basic concept of feedback control resides in the master-slave architecture based upon position control. The example below also is considered in similar fashion with regard to feed-forward.

The example shown in FIG. 6 is described in the specification of Japanese Patent Application Laid-Open (KOKAI) No. 3-252704. Except for the difference in expression indicated in the relations of Equation (1), this arrangement is equivalent to that of FIG. 4 as far as the basic characteristic of synchronization control is concerned. This may be illustrated as follows: Specifically, C3(s) in FIG. 6 is the synchronizing compensating unit, and the output value ux is expressed by Equation (2) below:

$$ux = C3(s)\{(r - y1) - (r - y2)\} \quad (2)$$
$$= -C3(s)(y1 - y2)$$

Here the input value to C3(s) is the same as the synchronization error in the example of FIG. 4. Since the control system of FIG. 6 is so arranged that ux is applied to the second system as negative feedback, it will be understood that this arrangement is identical with the master-slave arrangement having the feed-forward path of FIG. 5.

The two examples set forth above differ in terms of the arithmetic architecture but are equivalent in terms of their characteristics. Both are master-slave control systems for two-axis position control. An example different from these is shown in FIG. 7, which illustrates a control system disclosed in the specification of Japanese Patent Application Laid-Open (KOKAI) No. 62-226206. The example of FIG. 7 is fundamentally defective in that the two-axis position outputs y1 and y2 do not follow up the reference input r. However, its basic stance regarding synchronization control will be interpreted and discussed favorably below. That is, the chief feature of this arrangement is that the output signals are joined by being crossed at the output stage of the two-axis drive system. In the master-slave architectures shown in FIGS. 4 and 6, the signal flow is simple, i.e., from the master system to the slave system. In the example of FIG. 7, on the other hand, the basic architecture is such that the two systems are in parallel and interfere with each other on an equal footing. This is referred to as "bilateral" architecture that does away with the master-slave relationship.

Before describing the general problems that arise with the techniques mentioned above, the problems with the bilateral synchronization control configuration will be pointed out. Apart from the example of FIG. 7, which possesses obvious defects, the bilateral configuration is actually preferred in general terms from the standpoint of synchronization control. However, the following two problems frequently arise at the factory where the control system is actually designed:

The first problem is that the overall system is influenced by external disturbance affecting either one of the two systems, and that the resulting oscillation does not readily converge. The second problem is that there are several closed control loops in the two-axis system and it is very difficult to design a compensating device that stabilizes each of the loops simultaneously. The reason why the response to external disturbances is poor is that the dynamics of each system are governed by the slowest oscillation mode, vis-a-vis any disturbance, of the overall system. In the case of the master-slave configuration, the influence of external disturbance can be eliminated owing to the quick-response dynamics solely of the slave system, with regard to synchronization precision. In addition, the master system having the slow-response dynamics is entirely unaffected with regard to disturbances that enter the slave system. These are the advantages of the master-slave system.

The difficulty encountered in designing the compensating devices in the bilateral configuration stems from the fact that it is not possible to simply design each system individually. For instance, assume a case where the compensating device C1(s) is designed based upon the axial characteristic P1(s) in the example of FIG. 7. Even though stabilization of the simple loop containing P1 and C1 may be achieved, no consideration is given to signal components fed back to the simple loop from P1 through C2 and, further, through P2. Such design of characteristics is unsatisfactory. Generally, in order to design the compensating devices of a such a compound system, use of multiple-variable control theory and an associated CAD is desirable. Frequently, however, the result is not only a complicated arrangement for joining signals but also a complicated compensating device, i.e., a higher order arithmetic configuration. Accordingly, this expedient is not easy to realize.

Pointing out the problems of the bilateral arrangement is the same as describing the merits of the master-slave configuration. However, the intention here is not to conclude that the master-slave configuration is almighty. The correct expression would be to say that the bilateral configuration is advantageous in terms of general control theory and the master-slave configuration is advantageous in terms of practical theory.

FIG. 8 illustrates a more universal bilateral control arrangement, though it is not necessarily the most general. Here it is assumed that the servo band of the axial characteristic P2 is sufficiently high in comparison with P1. Further, it is assumed that the four compensating devices C11, C12, C21, C22 calculate the optimum values by employing a CAD to design the appropriate control system. Naturally, the optimization cost function that relates to the synchronization error y1−y2 is essential, and use is made of a weighted quadratic integral, for example, inclusive of velocity deviations along the respective axes. Though illustrating this numerically using examples would be advisable, here we will go no further than to discuss a summary of the results. The compensating device C12(s) for interference from the second system to the first system has a very small gain in comparison with the other compensating devices and the assigned pole zero is sufficiently high, this corresponding to the pole of P2(s). In other words, one arrives at the conclusion that it is possible for the signal path having the compensating device C12 to be eliminated. The reasoning is based on the interpretation that the meaning of artificially combining a fast dynamic characteristic and a slow dynamic characteristic, which are essentially physically separate, is superficial, and that if these characteristics are combined, the effect upon the cost function will be deleterious to the extent that the system of the fast dynamic characteristic is held back by the system of the slow dynamic characteristic. If the path of the compensating device C12 is eliminated in FIG. 8, the signal flow will become unidirectional, i.e., from the first axis to the second axis, and the system obtained will be equivalent to that of the master-slave configuration.

The features of a synchronization control arrangement may be summarized as follows: The universal expression of a two-axis control system in general terms is the bilateral architecture, considered to include the master-slave configuration, which is a special example thereof, as the result of setting the optimum parameters. With the bilateral architecture, however, there are redundant components. This means that a large number of compensating devices must be designed in comparison with the master-slave arrangement. Furthermore, considerable labor and expense is required to stabilize each loop. If there is a clear difference in response between the two axes, the shortest recourse to take in design on the basis of this knowledge would be to construct a control system of the master-slave type, in which the axis having the dominant characteristic is taken as the master system and the axis having the high band characteristic is taken as the slave axis. With a master-slave configuration, designing the compensating devices involves no difficulty whatsoever since the stabilization adjustment is performed only for each axis. Furthermore, if the difference in the response between the two axes is slight, the fact that the controlled system is a two-axis parallel system in which identical operations are capable of being performed means that this difference has little importance in terms of a design problem, the purpose of which is to satisfy the synchronizing specifications.

In the examples mentioned thus far, the common problems exhibit a certain feature. In all three of the examples of FIGS. 4, 6 and 7, the controlled variable is position or a relative position between two axes. In other words, it will be understood that all of the foregoing examples achieve synchronization control in the form of a position control system. Since synchronism is evaluated in terms of relative positions, these examples represent concepts based upon a direct approach. However, in a case where a moving control system of some kind is considered, there are many instances in which controlling velocity is more important and more effective than controlling position. This can readily be understood from the fact that a position signal exhibits a phase lag of 90° as compared to a velocity signal. In regard to synchronization control, the idea of applying velocity-related synchronization in advance has not been clarified heretofore and represents a point overlooked in the prior art.

The prior art mentioned above has a number of problems. Specifically, with the bilateral arrangement that aims at universality, the architecture is complicated and it is difficult to design the stabilizing compensating devices. With the master-slave configuration based upon position control, an operating delay appears in the slave system. Measures for simultaneously realizing synchronization control and velocity control have not been implemented. Attendant problems are higher design cost and more difficult maintenance. Furthermore, in addition to the problems relating to the architecture of synchronization control systems, there are problems relating to suitable ways to synchronize control circuitry and measurement circuitry when implementing the system by hardware.

SUMMARY OF THE INVENTION

Accordingly, an object of the present invention is to provide a synchronization control apparatus and method through which synchronizing precision is improved, by a simple arrangement, in synchronization control for making the operation of a second drive system follow up the operation of a first drive system. This is accomplished by performing synchronization control using position information and velocity information based upon operation of the first drive system.

Another object of the present invention is to make it possible to implement control of the first and second drive systems each by a single-axis drive control system, thereby facilitating the design of compensating devices and the like.

Yet another object of the present invention is to make it possible to construct each of the drive systems by a single-axis drive system by adopting an arrangement in which the first drive system is used as a velocity minor loop and the second drive system is used as a velocity minor loop and position minor loop, and supplying velocity information and position information from the first drive system to the velocity minor loop and position minor loop, respectively, of the second drive system.

A further object of the present invention is to realize synchronization of position measurement in the first and second drive systems as well as synchronization between position measurement and velocity control in each of these systems, and to improve synchronizing precision during operation of the first and second drive systems.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENT

Preferred embodiments of the present invention will now be described in detail in accordance with the accompanying drawings.

In the description of the embodiment given below, the concept of synchronization control according to the embodiment will be discussed first, then a more specific example of the control architecture and finally an example in which the invention is applied to a semiconductor exposure apparatus.

The control apparatus of this embodiment is characterized in that two-axis synchronization control is carried out not by a position control system but by a velocity control system.

In general, designing a stabilizing compensating device in a velocity control system rather than in a position control system makes it possible to achieve a higher band of frequencies as the frequency characteristic of the feedback system. The reason for is that is the difference afforded by one integration characteristic. This is based upon basic control theory, which holds that the phase lag of signal transfer is less by 90° in the velocity control system, and that this is advantageous in terms of setting loop gain. In the synchronization control system according to the prior art, synchronization error is eliminated in the position control system. The fundamental idea behind this invention is primarily the suppression of synchronization error in the velocity control system. However, since synchronization error is evaluated by relative position, i.e., in units of position, a synchronized compensation loop must also be provided for position control.

Figure 1:
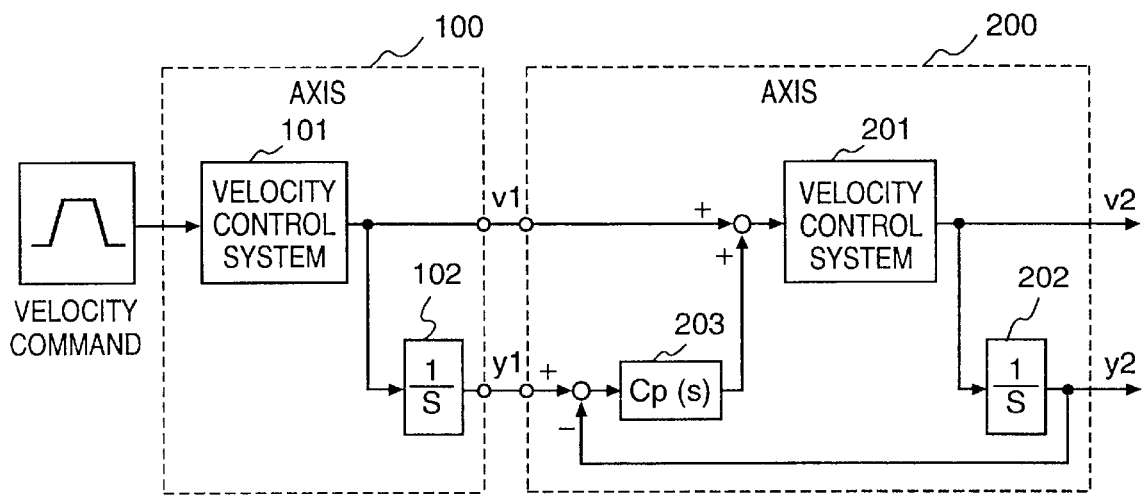
FIG. 1 is a diagram for describing the general features of a synchronization control apparatus according to an embodiment of the present invention.

FIG. 1 illustrates the concept of this embodiment. Velocity control systems 101, 201 are provided for two drive systems (axis 100 and axis 200), respectively. A master-slave system for velocity control is constructed, wherein whichever of the two axes has the slower response is provided upstream of the signal flow. Velocity v1 of the master system is transmitted to the slave system and enters the slave system as a velocity command value for controlling the velocity of the slave system. Though this portion is the backbone, there is one more transfer function from the master system to the slave system. This is a detected value y1 of master axis position, which is transmitted to the slave side. It should be noted that the value y1 is obtained by integrating v1 using an integrator 102. As a result, synchronously detected master-slave relative position is recognized on the slave side. The recognized relative position is operated on by a compensating device [Cp(s)] 203, and the result of calculation is added to the input value v1 as a corrective quantity for the velocity command value applied to the velocity control system 201.

By virtue of this architecture, loop gain can be raised up to the high-frequency region and it is possible to improve suppression of external disturbances and the command-value follow-up characteristic. Though the operation is obvious from the illustrated architecture, velocity control, which has not been positively considered in the prior art, is made possible in a form of the input of a velocity target value. The result is that a position command signal having the shape of a ramp function is made unnecessary.

Figure 2:
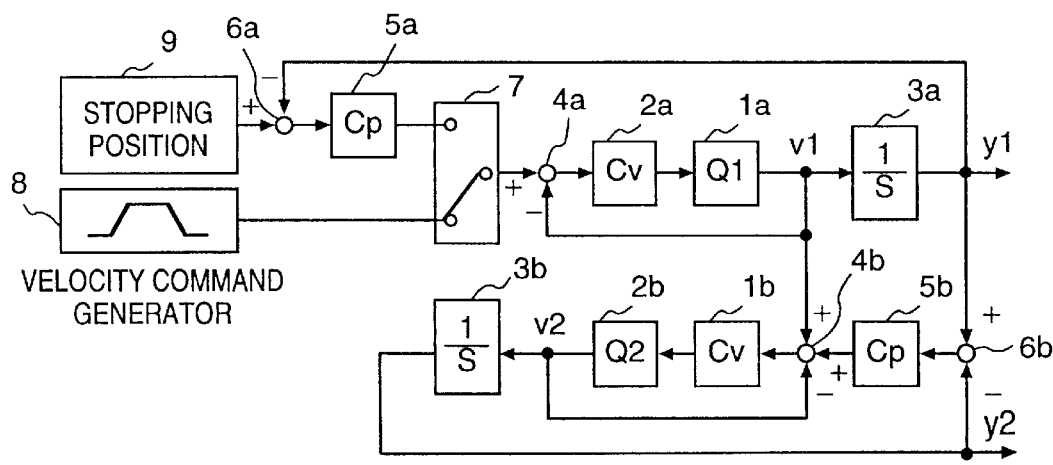
FIG. 2 is a block diagram illustrating the control architecture of the synchronization control apparatus according to the embodiment of the present invention.
Figure 3:
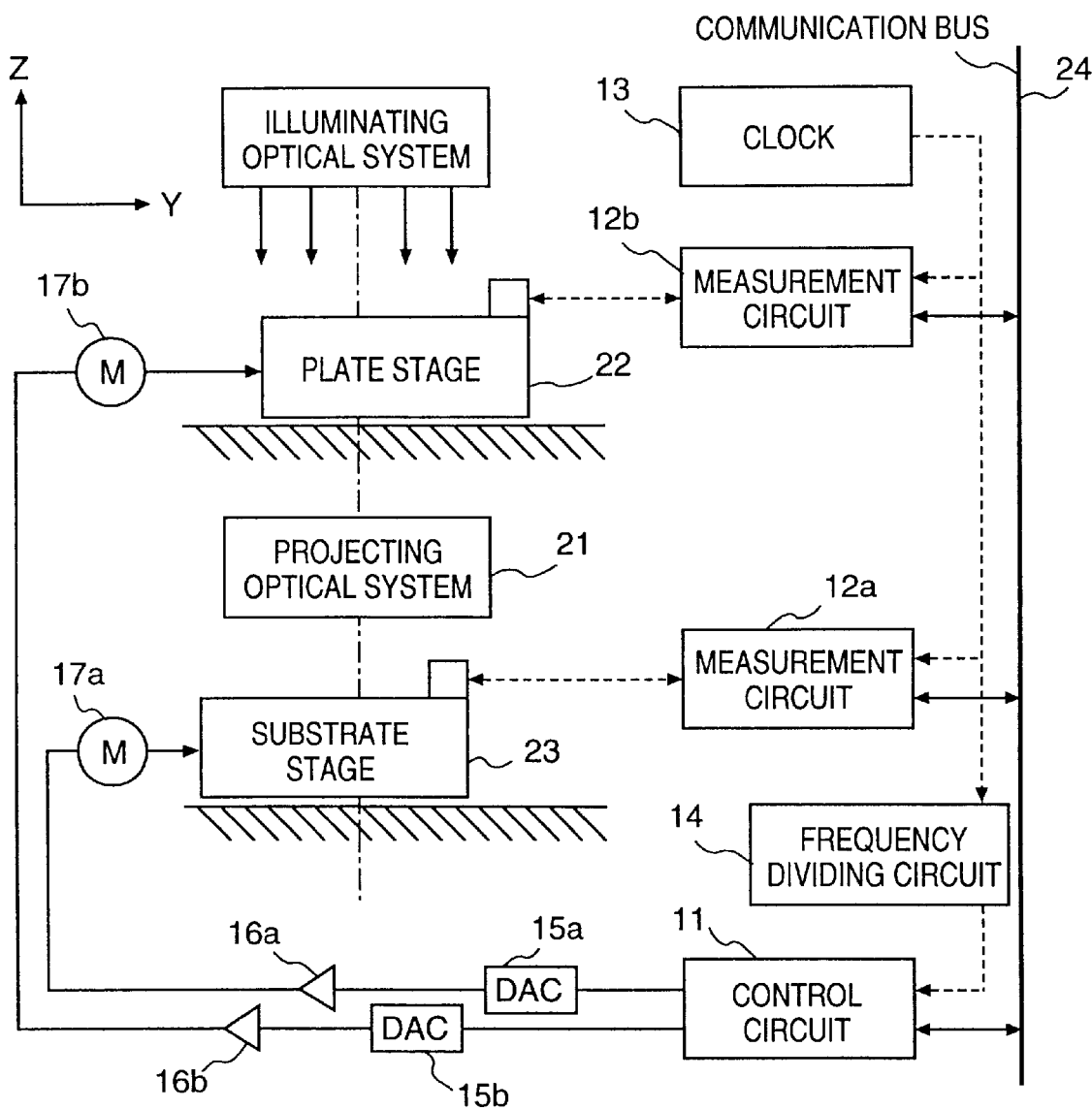
FIG. 3 is a diagram for describing control architecture in which the synchronization control apparatus of the embodiment is applied to a semiconductor exposure apparatus.
Figure 4:
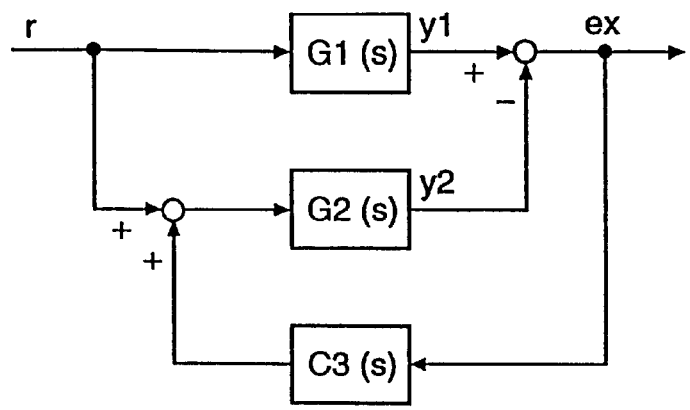
FIG. 4 is a block diagram illustrating an example of the control architecture of a common synchronization control apparatus.
Figure 5:
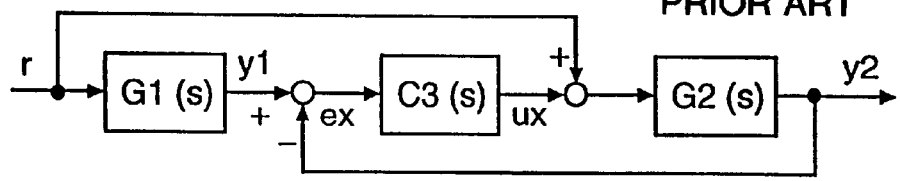
FIG. 5 is a block diagram obtained by subjecting the control architecture of FIG. 4 to an equivalent conversion.
Figure 6:
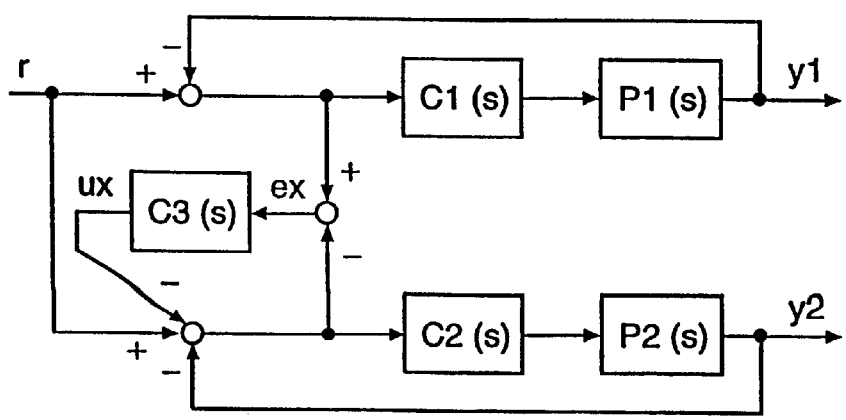
FIG. 6 is a block diagram illustrating an example of the control architecture of another common synchronization control apparatus.
Figure 7:
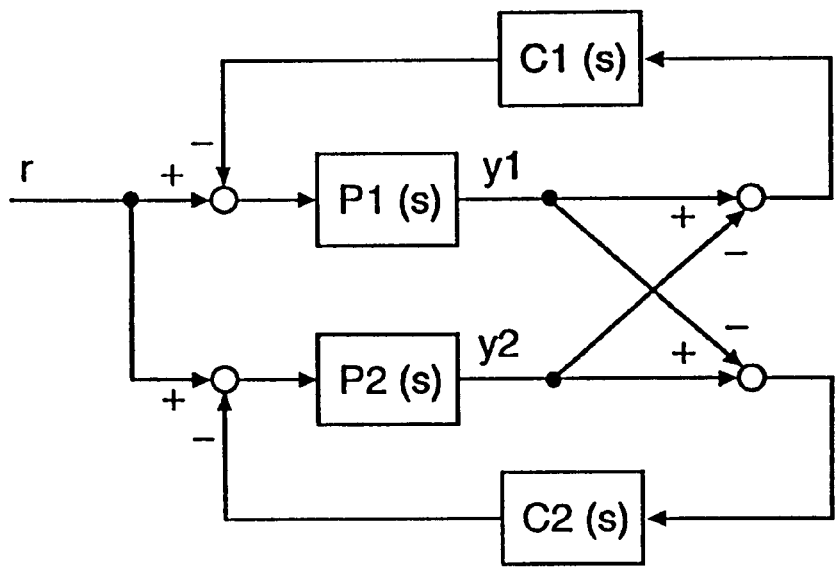
FIG. 7 is a block diagram illustrating an example of the control architecture of yet another common synchronization control apparatus.
Figure 8:
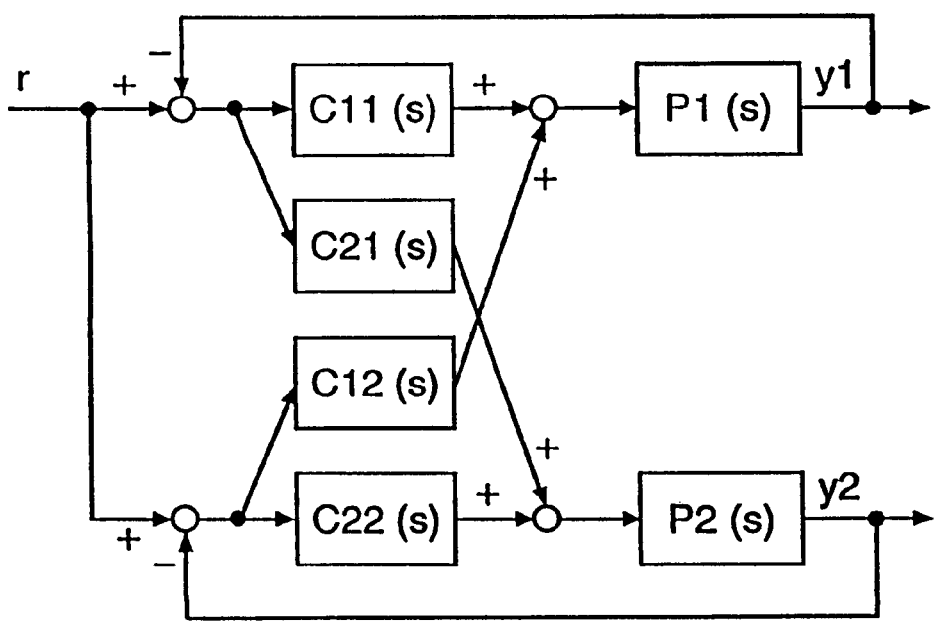
FIG. 8 is a block diagram illustrating basic control architecture of common bilateral type.

One embodiment of the present invention is illustrated in FIGS. 2 and 3. This is an embodiment in which the invention is applied to a semiconductor exposure apparatus. The connections among the various elements and the overall system in the form of hardware are shown in FIG. 3. The synchronization control architecture implemented by the control circuitry is expressed in FIG. 2.

In FIG. 2, y1, y2 represent the position information of the respective axes and v1, v2 represent the velocity information of the respective axes. This is similar to FIG. 1. FIG. 2 illustrates the approach to the control architecture that aims at two-axis synchronization and will be described in accordance with the signal flow. First, this control system has two control modes, namely a scanning mode and a positioning mode, which are switched between by a signal selector 7. Here scanning control, which includes velocity control, is the main purpose, and the positioning mode is therefore considered to be supplementary. Accordingly, description will be limited to the scanning mode. Further, it will be assumed that the axis having the output y1 is in the master system and that the axis having the output y2 is in the slave system.

The velocity command value is produced by a velocity command generator 8 and enters the master system. It should be noted that the command value enters only the master system and has no direct effect upon the slave system. A comparator 4a compares the velocity command value with the velocity v1 and applies the error signal between them to a velocity compensating device 2a. Physically speaking, the output of the velocity compensating device 2a is a manipulated variable that enters a motor via a D/A converter and power amplifier in the master system. The master system has a dynamic characteristic 1a represented by a transfer function Q1, which constructs a velocity control minor loop in cooperation with a transfer function Cv of the velocity compensating device. An integrator 3a represents the relationship between the velocity v1 and the corresponding position y1. Though the master system has been mainly described, the slave system is similarly constructed and corresponding reference characters are used to identify its elements.

The important point here is the relationship between the master and slave systems. The flow of signals between the two is unidirectional, namely from the master system to the slave system. The information transferred between the two axes is the velocity v1 and the position y1. The velocity signal v1 is transmitted as a command value, or as a part thereof, to the velocity control minor loop of the slave system. The position signal y1 is compared with the position y2 of the slave system and the error between them, namely the synchronization error, enters a slave-system position compensating device 5b. The latter can also be referred to as a synchronizing compensating device and functions to null the synchronization error. It is designed so as to have at least one integration characteristic. The output signal of the position compensating device 5b enters the velocity minor loop of the slave system and is added to the velocity input v1, whereby slave-system velocity command value is produced. Changing one's point of view, this can be interpreted as follows. The slave system is the familiar one-axis drive control system having a velocity minor loop and a position minor loop, and corresponding signals from the master system are introduced to the velocity and position comparison points. Accordingly, the procedure for designing the compensating devices Cv, Cp can be deduced from the transfer functions of the individual axes. This is a reasonable, natural configuration in terms of implementation.

Reference will now be had to FIG. 3, which is a diagram illustrating the connections when this control system is applied to a semiconductor exposure apparatus. A two-axis drive system having a plate stage 22 and a substrate stage 23 with a projecting optical system 21 interposed between them is prepared. Since the illustrated semiconductor exposure apparatus transfers image information on the plate stage while scanning the substrate stage, it is required that both stages be driven accurately upon taking the reduction ratio of the projecting optical system into consideration. A laser interferometer is used to measure the positions of these stages. Length measurement circuits are represented by 12a, 12b, and motors serving as the sources of drive for the stages are represented by 17a, 17b. The length measurement circuits 12a, 12b for the two axes are connected to a control circuit 11 by a communication bus 24. The control circuit 11 produces outputs for the two axes. These outputs are applied to motors 17a, 17b via D/A converters 15a, 15b and power amplifiers 16a, 16b, respectively. Which stage is in the master system and which is in the slave system is not clearly expressed. However, whichever stage is provided with, say, a fine positioning mechanism and has the slower response is the master. Furthermore, the point expressed in FIG. 3 is electrical synchronization between the circuits.

The positioning precision required for exposure and transfer in the field of semiconductor photolithography is less than submicron order. In a conventional step-and-repeat exposure apparatus, such precision is demanded only in a stationary measurement environment. In a scanning-type exposure apparatus, a precision of this high order is required also during motion. The stationary precision mentioned here is, as it were, spatial precision in positional coordinates. On the other hand, precision during motion requires that the time axis be taken into account as well, and administration of timing in which temporal precision takes the place of spatial precision is essential.

FIG. 3 illustrates not only the connections among the elements but also an embodiment of such management of timing between the control circuit 11 and the two length measurement circuits 12a, 12b. A clock generating circuit 13 produces an output applied directly to the two length measurement circuits 12a, 12b and delivered to the control circuit 11 via a frequency divider circuit 14. The clock generating circuit 13 internally incorporates a quartz oscillator having a high frequency, by way of example, and provides a reference clock for the internal operating cycle of the length measurement circuits 12a, 12b, output latches and communication timing. The timing input signal (the output signal of the frequency divider 14) to the control circuit 11 is not a reference clock for the central processor in the control circuit 11 but is used as a trigger signal for triggering control-operation interrupt processing. This embodiment makes it possible to synchronize measurement of the positions of the two stages and to synchronize position measurement and the control operation, both at the required accuracy.

It should be noted that the control circuit 11 includes the control architecture depicted in FIG. 2 and operates as follows, in sync with the frequency-divided clock from the frequency divider circuit 14: Measurement data are acquired from the length measurement circuits 12a, 12b in sync with the frequency-divided clock signal and the velocity command generator 8 generates the velocity command value based upon the data acquired. The velocity command value is generated based upon the difference between the measurement data from the length measurement circuits 12a, 12b and the amount of positional offset of each stage, which is based upon the measurement data. For example, if the difference between the target position and the stage position is large, the velocity command value is generated so as to drive the stage at high velocity. If the difference between the positions of the two stages is large, the velocity command value is generated so as to specify drive at a lower velocity, thereby reducing the positional difference between the two stages.

Accordingly, the synchronization precision of this system is adjusted by the period of measurement performed by the length measurement circuits 12a, 12b and the period at which the velocity command value is generated in the control circuit. This means that the desired synchronization precision can be achieved by adjusting the clock period of the clock generating circuit 13 and the frequency dividing ratio of the frequency divider circuit 14 in accordance with the precision required by the system.

Thus, in accordance with the invention, it is possible to realize a synchronous scanning control apparatus having a highly precise characteristic and a dynamic characteristic contrived for a higher frequency band. This contributes to an improvement in the throughput of the overall apparatus and manufacturing line. Furthermore, since the control architecture is primarily directed to velocity control, highly precise control of velocity can be achieved in contrast with the conventional techniques which makes the device's position follow a signal having fluctuation.

Further, owing to the advantage of the simple configuration in line with the master-slave approach, design, adjustment and maintenance costs can be reduced at the plant where the apparatus is designed and manufactured.

As many apparently widely different embodiments of the present invention can be made without departing from the spirit and scope thereof, it is to be understood that the invention is not limited to the specific embodiments thereof except as defined in the appended claims.

What is claimed is:

1. A synchronization control apparatus for controlling synchronization of a first drive system and a second drive system, comprising:

first drive means for driving the first drive system based upon an entered velocity command value;

output means for outputting first velocity information and first position information on the basis of operation of the first drive system driven by said first driving means; and second drive means for synchronizing operation of the second drive system to operation of the first drive system by driving said second drive system based upon the first velocity information and the first position information from said output means.

2. The apparatus according to claim 1, wherein response of the first drive system is slower than response of the second drive system.

3. The apparatus according to claim 1, wherein said output means includes:

first velocity information output means for outputting the first velocity information, which corresponds to operating velocity of the first drive system; and position information output means for generating and outputting the first position information, which indicates position of the first drive system, based upon the first velocity information.

4. The apparatus according to claim 1, wherein said first drive means has a feedback loop for feeding back the first velocity information and controls the operation of the first drive system based upon the velocity command value and the first velocity information that has been fed back.

5. The apparatus according to claim 1, wherein said second drive means includes:

velocity control means for controlling the operation of said second drive system by the velocity command value, which is based upon the first velocity information;

output means for generating and outputting second velocity information based upon the operation of the second drive system by said velocity control means; and compensating means for generating second position information, which indicates position of the second drive system, based upon the second velocity information, and correcting the velocity command value, which enters said velocity control means, based upon the second position information.

6. The apparatus according to claim 5, wherein said velocity control means has a feedback loop for feeding back the second velocity information and controlling the operation of the second drive system based upon the velocity command value corrected by said compensating means and the second velocity information that has been fed back.

7. The apparatus according to claim 1, further comprising:

measuring means for measuring, substantially simultaneously, position of the first drive system and position of the second drive system; and generating means for generating the velocity command value, which is to be entered into the first drive system, based upon the positions obtained by said measuring means.

8. The apparatus according to claim 1, further comprising clock generating means for generating a clock having a prescribed period;

wherein said measuring means measures the positions of the first and second drive means in sync with the clock generated by said clock generating means.

9. The apparatus according to claim 8, further comprising frequency dividing means for frequency-dividing the clock;

wherein said generating means generates the velocity command value in sync with the frequency-divided clock obtained by said frequency dividing means.

10. The apparatus according to claim 7, wherein either one of the first drive system and second drive system is a substrate stage of device manufacturing apparatus and the other is a plate stage of said device manufacturing apparatus.

11. The apparatus according to claim 1, further comprising generating means for generating second position information based on operation of the second drive system and outputting the second position information, wherein said second drive means synchronizes the operation of the second drive system with the operation of the first drive system by controlling a position of the second drive system based on deviation between the first position information and the second position information.

12. A synchronization control method for controlling synchronization of a first drive system and a second drive system, comprising:

a first drive step of driving the first drive system based upon an entered velocity command value;

an output step of outputting first velocity information and first position information on the basis of operation of the first drive system driven at said first driving step; and a second drive step of synchronizing operation of the second drive system to operation of the first drive system by driving said second drive system based upon the first velocity information and the first position information outputted at said output step.

13. The method according to claim 12, wherein response of the first drive system is slower than response of the second drive system.

14. The method according to claim 12, wherein said output step includes:

a first velocity information output step of outputting the first velocity information, which corresponds to operating velocity of the first drive system; and a position information output step of generating and outputting the first position information, which indicates position of the first drive system, based upon the first velocity information.

15. The method according to claim 12, wherein said first drive step has a feedback loop for feeding back the first velocity information and controls the operation of the first drive system based upon the velocity command value and the first velocity information that has been fed back.

16. The method according to claim 12, wherein said second drive step includes:
a velocity control step of controlling the operation of said second drive system by the velocity command value, which is based upon the first velocity information;
an output means step of generating and outputting second velocity information based upon the operation of the second drive system at said velocity control step; and
a compensating step of generating second position information, which indicates position of the second drive system, based upon the second velocity information, and correcting the velocity command value, which enters said velocity control step, based upon the second position information.

17. The method according to claim 16, wherein said velocity control step has a feedback loop for feeding back the second velocity information and controlling the operation of the second drive system based upon the velocity command value corrected at said compensating step and the second velocity information that has been fed back.

18. The method according to claim 12, further comprising:
a measuring step of measuring, substantially simultaneously, position of the first drive system and position of the second drive system; and
a generating step of generating the velocity command value, which is to be entered into the first drive system, based upon the positions obtained at said measuring step.

19. The method according to claim 18, further comprising a clock generating step of generating a clock having a prescribed period;
wherein said measuring step measures the positions of the first and second drive means in sync with the clock generated at said clock generating step.

20. The method according to claim 19, further comprising a frequency dividing step of frequency-dividing the clock;
wherein said generating step generates the velocity command value in sync with the frequency-divided clock obtained at said frequency dividing step.

21. The method according to claim 18, wherein either one of the first drive system and second drive system is a substrate stage of device manufacturing apparatus and the other is a plate stage of said device manufacturing apparatus.

22. The method according to claim 11, further comprising a generating step of generating second position information based on operation of the second drive system and outputting the second position information,
wherein, in said second drive step, the operation of the second drive system is synchronized with the operation of the first drive system by controlling a position of the second drive system based on deviation between the first position information and the second position information.

* * * * *

UNITED STATES PATENT AND TRADEMARK OFFICE
CERTIFICATE OF CORRECTION

PATENT NO. : 5,917,294

DATED : June 29, 1999

INVENTOR(S): REIJI MITARAI

It is certified that error appears in the above-identified patent and that said Letters Patent is hereby corrected as shown below:

COLUMN 2,
Line 17, "below):" should read --below:--.

COLUMN 6,
Line 5, "for is that is the" should read --for this is that the--.

COLUMN 12,
Line 19, "claim 11," should read --claim 12,--.

Signed and Sealed this

Eighth Day of February, 2000

Attest:

Q. TODD DICKINSON

Attesting Officer

Commissioner of Patents and Trademarks